United States Patent [19]
Erickson

[11] 4,383,333
[45] May 10, 1983

[54] AM RADIO HAVING AN AUTOMATIC FINE TUNING CIRCUIT

[75] Inventor: Bert K. Erickson, Fayetteville, N.Y.

[73] Assignee: General Electric Company, New York, N.Y.

[21] Appl. No.: 240,298

[22] Filed: Mar. 4, 1981

[51] Int. Cl.³ .................................................. H04B 1/16
[52] U.S. Cl. ...................................... 455/182; 455/192; 455/197
[58] Field of Search .............. 455/164, 173, 182, 192, 455/257, 258, 261, 262, 289, 339, 340, 197

[56] References Cited
U.S. PATENT DOCUMENTS

| | | |
|---|---|---|
| 2,516,856 | 8/1950 | Cowles .................................. 455/162 |
| 2,791,685 | 5/1957 | Hill et al. ............................... 455/162 |
| 3,447,087 | 5/1969 | Takezaki et al. ...................... 455/164 |
| 3,495,195 | 2/1970 | Ribour ................................... 455/192 |
| 4,004,231 | 1/1977 | Elshuber ................................ 455/182 |

*Primary Examiner*—Marc E. Bookbinder
*Attorney, Agent, or Firm*—Carlos Nieves; John R. Rafter; George R. Powers

[57] ABSTRACT

An AM superheterodyne radio receiver has an RF filter which includes a biased varactor for providing a trimming capacitance and provides an AGC signal when it is tuned to a broadcast AM signal. The AGC signal and a derived time derivative signal are used to provide binary signals which drive a logic circuit and the logic circuit controls a generator which biases the varactor. The biased varactor fine tunes the RF filter towards the carrier frequency of the broadcast AM signal.

13 Claims, 4 Drawing Figures

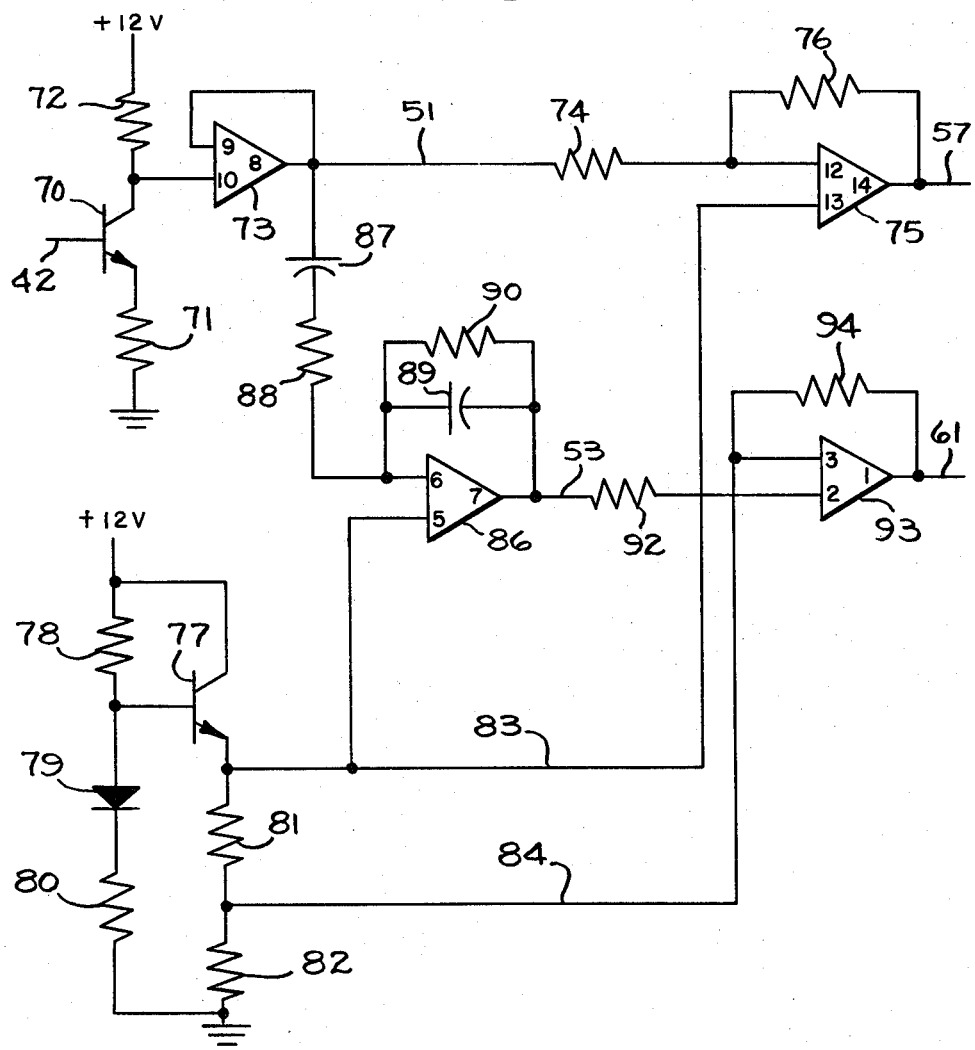

AM RADIO HAVING AN AUTOMATIC FINE TUNING CIRCUIT

BACKGROUND OF THE INVENTION

1. Field of the Invention

The subject invention relates to AM receivers having tunable RF circuits.

2. Description of Prior Art

Persons skilled in the art to which the invention described below is related are at least constructively aware of the technology disclosed in U.S. Pat. Nos. 2,791,685, 3,495,195 and 3,571,724.

So far as is considered pertinent, U.S. Pat. No. 2,791,685 discloses a superheterodyne type receiver wherein a motor is used to drive, in the tuning process, capacitors of RF and converter circuits. During tuning of the receiver to a transmitted carrier signal, a generated AGC voltage is combined with a signal related to the derivative of the AGC voltage to provide a control signal. As the receiver is tuned to the frequency of the transmitted carrier signal, the magnitude of the control signal rises rapidly and this change is used to stop the motor, thereby tuning the receiver to the transmitted carrier signal until the motor is restarted.

U.S. Pat. No. 3,495,195 discloses a varactor tuned RF filter circuit controlled by a digital to analog converter which is driven by a binary counter.

U.S. Pat. No. 3,571,724 discloses a signal seeking receiver wherein varactor diodes are used in tuning circuits of the receiver and a generated step voltage is used to tune the receiver through the frequency band to which the receiver is responsive. The stepping action is interrupted by circuitry responsive to receipt of a transmitted signal.

SUMMARY OF THE INVENTION

It is an object of the present invention to provide, in an AM superheterodyne radio receiver having coupled capacitors associated with RF and local oscillator filters, means for minimizing tracking errors in the receiver.

It is another object of the present invention to provide said means for minimizing tracking errors without generating noise which would interfere with reception of a signal to which the receiver is tuned.

Yet another object of the present invention is to provide an AM superheterodyne radio receiver having an RF filter section which need not be aligned, for tracking purposes, during manufacture of the receiver.

The invention herein may be described broadly as a tunable receiver for generating a signal related to amplitude modulation on a carrier signal provided by a signal source, the carrier signal having a frequency within a given band of frequencies. Structurally, the receiver includes a band-pass filter which is tunable within the band of frequencies to provide from an amplitude modulated carrier signal supplied by the source a proportionally related signal, and means responsive to the presence of said proportionally related signal for generating said signal related to modulation on a carrier signal and for generating a first control signal which is related to the magnitude of said proportionally related signal. The receiver also includes means for deriving a second control signal, the second control signal being related to the derivative with respect to time of the first control signal, and digital circuit means responsive to the first and second control signals for automatically fine tuning, with respect to the frequency of the carrier signal, the band-pass filter.

BRIEF DESCRIPTION OF THE DRAWINGS

The above-mentioned and other objects and features of the invention will become apparent by reference to the following description in conjunction with the accompanying drawings, in which:

FIG. 2 is a truth table which represents binary states on conductive lines of digital circuit means incorporated in the receiver;

FIG. 3 is a schematic diagram of a part of a receiver circuit which responds to an AGC type signal generated in the receiver to provide input signals for a gate arrangement.

DESCRIPTION OF A PREFERRED EMBODIMENT

Figure 1:
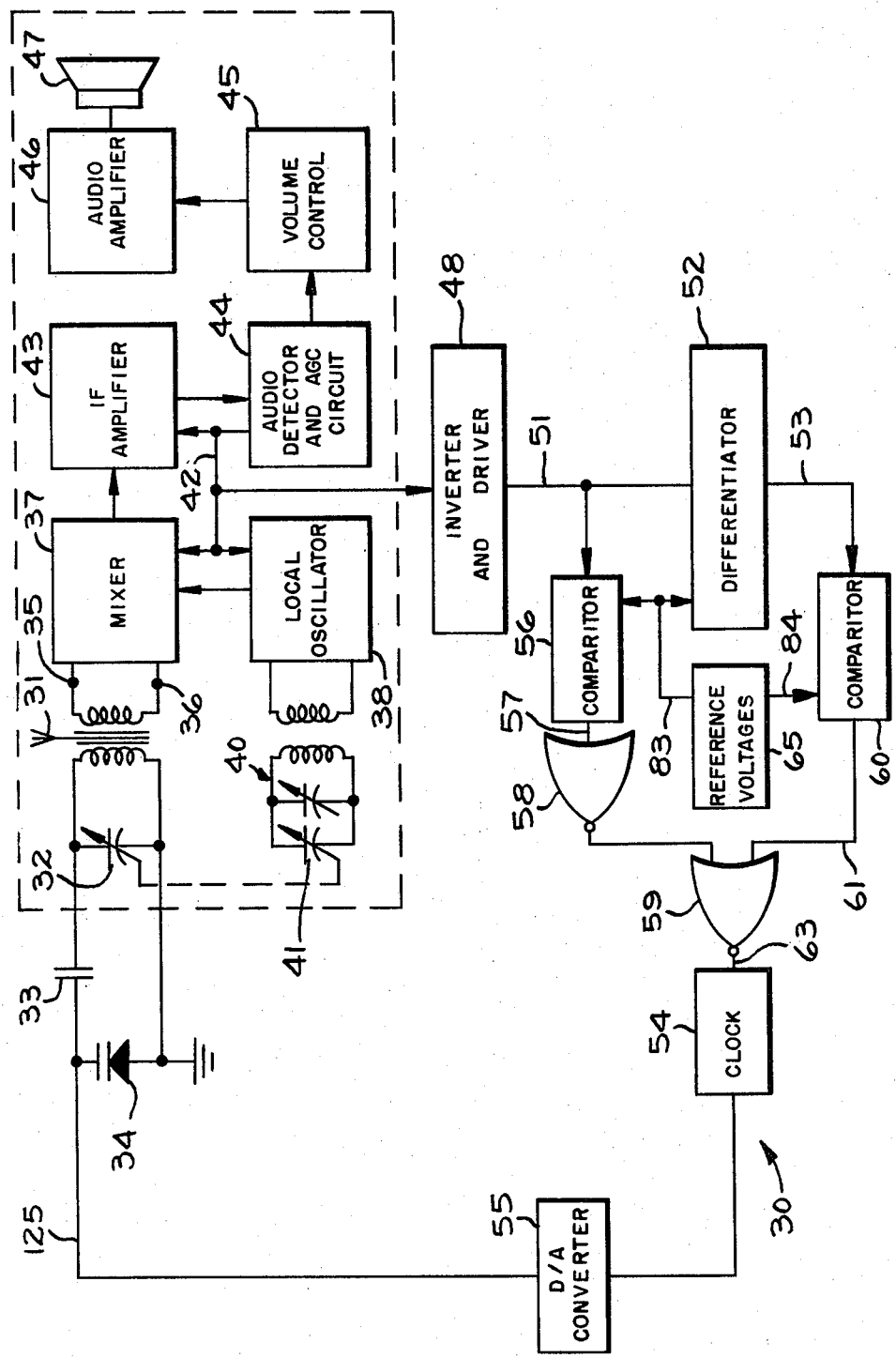
FIG. 1 is a block diagram of an AM radio receiver, according to the invention.

A block diagram of a tunable receiver 30 according to the invention, is disclosed in FIG. 1. In operation receiver 30 responds to a selectable amplitude modulated carrier signal available from the commercial AM broadcast band, and provides an electrical signal related to the modulation on the carrier selected. As will appear, the receiver includes means responsive to the electrical signal for providing an audio signal related to modulation on the carrier.

Referring to FIG. 1, receiver 30 includes a band-pass filter comprising a rod antenna 31 having primary and secondary windings. The primary winding is connected in parallel with a tuning capacitor 32 and with a series circuit including a DC blocking capacitor 33 and a voltage sensitive capacitor in the form of a varactor diode 34 known by commercial part no. BB105G. As more fully described below, diode 34 is biased to provide a trimming capacitance. As persons skilled in the receiver art would expect, inductance provided by the antenna and capacitance provided by capacitor 32 and varactor 34 principally determine the resonant or center frequency of the filter. An amplitude modulated carrier signal captured by the antenna causes a proportionally related signal to appear at output terminals 35 and 36 of the secondary winding, the proportionality being dependent on the difference between the center frequency to which the filter is tuned and the carrier frequency of the modulated signal.

Receiver 30 includes a mixer 37 which is driven by a local oscillator 38 whose frequency of oscillation is set by a tunable parallel resonant circuit 40. Circuit 40 includes a variable capacitor 41 which is mechanically coupled to capacitor 32 and is tuned to an RF frequency which is higher than the center frequency of the band-pass filter by a nominal 455 kHz. The 455 kHz difference tends to be maintained when different carrier signals are tuned because, as will appear, when the local oscillator is tuned 455 kHz above a received amplitude modulated signal, a bias is applied to varactor 34 and this fine tunes the band-pass filter towards the carrier frequency of the amplitude-modulated signal. The IF output port of mixer 37 is coupled to an IF amplifier 43 of suitable bandwidth and the amplifier drives an audio detector and AGC circuit 44. In turn, the circuit provides an audio frequency electrical signal related to the modulation on a received signal to a volume control circuit 45 and an AGC signal on line 42. The volume control is coupled by an audio amplifier 46 to a speaker 47 which generates an audio signal related to the modulation on the received amplitude modulated signal. The AGC signal on line 42, as is typical, provides a measure of the strength of a signal being received and is used to control the gain function of the local oscillator 38, mixer 37 and IF amplifier 43. Line 42 is also connected to an inverter and driver circuit 48 which provides on line 51 a first control signal, the magnitude of this signal being related to the strength of the amplitude modulated signal being applied at terminals 35 and 36, it being understood that, in this example, the carrier frequency of this signal is nominally 455 kHz below the frequency provided by oscillator 38.

Line 51 is coupled to a differentiator 52 for providing on an output line 53 a second control signal, this signal being related to the derivative with respect to time, of the first control signal.

Digital circuit means of the receiver respond to the first and second control signals and provide a voltage which biases varactor 34, thereby fine tuning the band-pass filter toward the carrier frequency of an AM signal being received. More specifically, varactor 34 is biased by a signal generator under the control of a logic circuit which is responsive to the first and second control signals. The signal generator includes a clock 54 which drives a digital-to-analog converter 55 to provide a periodic staircase signal for biasing the varactor. The staircase signal, in this example, incrementally fine tunes the band-pass filter and, it should be noted, that the extent to which fine tuning occurs is effected by the voltage differential between generated steps. The stepping function of the converter is dependent upon the receipt of pulses from the clock and, therefore, any output level from the converter can be held or changed by stopping the clock or by letting it run, respectively. The logic circuit determines whether the clock 54 runs or not. Structurally, the logic circuit includes a comparator 56, coupled to line 51, which provides a logic 0 level on line 57 unless the magnitude of the first control signal exceeds a predetermined level corresponding to the presence of a signal at the antenna which can be processed to provide an acceptable audio signal from the speaker. When an acceptable signal is received, comparator 56 provides a logic 1 level on line 57. Line 57 is connected to an inverter 58, which in the subject receiver is implemented with a NOR gate, and the output of inverter 58 is connected to an input of another NOR gate 59. The logic circuit also includes a comparator 60 which responds to the second control signal on line 53. When the magnitude of the second control signal is less than some predetermined amount, corresponding to the absence of an acceptable signal at the antenna or the presence of an amplitude modulated signal at terminals 35 and 36 whose magnitude is not being varied appreciably by fine tuning of the band-pass filter, a binary 0 level appears on line 61. When the second control signal appearing on line 53 exceeds the predetermined amount, a binary 1 level appears on line 61, which is connected to another input of NOR gate 59. The output terminal of NOR gate 59 is coupled to clock 54 by a line 63 and, as persons skilled in logic design will appreciate, the first binary signal on line 57 and the second binary signal on line 61 determine the binary state present on line 63. From the truth table shown in FIG. 2, which corresponds to the NOR gate arrangement, it should be noted that a binary 1 state appears on line 63 only when the band-pass filter is substantially tuned to the carrier frequency of a modulated signal and the strength of the signal exceeds a predetermined threshold level. At all other times, a binary 0 appears on line 63. Clock 54 runs when a binary 0 is on line 63 and stops when a binary 1 is present, therefore, in operation the signal generator periodically sweeps the band-pass filter (through a limited band of frequencies) until a suitable signal is tuned, at which time the sweeping action stops.

A receiver, as described above, has been built using a properly complemented AM/FM integrated circuit. The AM/FM circuit used is sold by AEG-Telefunken with part number TDA 1083 and provides at one of its terminals an AGC voltage such as has been referred to with reference to line 42 in FIG. 1. In this connection, it may be noted that substantially similar AM/FM circuits are sold by Toshiba and Hitachi under part nos. TA 7613R and HA 12402, respectively.

In FIG. 3, there is shown a circuit which shows in more detail what is represented by boxes 48, 52, 56 and 65 in FIG. 1. As may be seen, the circuit uses a quad operational amplifier, manufactured by Motorola Semiconductor Products under part no. MC 3403P and other components to supply binary signals to lines 57 and 61. In the circuit, line 42 is connected to the base electrodes of a transistor 70 whose emitter electrode is coupled to ground by a resistor 71 and whose collector electrode is coupled to a 12 volts power supply by a resistor 72. With this arrangement input AGC signals are inverted by the transistor and held between 4 and 9 volts at the collector electrode. A first section 73 of the quad operational amplifier includes input pins 9, 10 and output pin 8. The collector electrode of transistor 70 is connected to pin 10, pin 9 is connected to pin 8 and pin 8 is connected to line 51. As connected, section 73 functions as a voltage follower or driver which places a 4 to 9 volts signal on line 51. Line 51 is coupled by a resistor 74 to pin 12 of a second section 75 of the quad operational amplifier. Pin 12 of section 75 is connected by a resistor 76 to pin 14 and a 4.49 volts reference voltage, the origin of which is described below, is connected to pin 13. As connected, section 75 functions as a comparator with prescribed hysteresis. In the circuit the ratio of the value of resistor 76 to the value of resistor 74 determines the hysteresis range and the reference voltage determines the midpoint voltage. In operation voltages on line 51 which exceed the upper hysteresis level cause a binary 1 level to appear on line 57 and voltages on line 51 which drop below the lower hysteresis level cause a binary 0 level to appear on line 57.

The 4.49 reference voltage is provided by a circuit including a transistor 77 having its collector electrode connected directly to the 12 volts power supply and its base electrode coupled by a bias resistor 78 to the supply. The base electrode is connected to the anode of a diode 79 whose cathode is coupled to ground by a resistor 80. The emitter electrode is coupled to ground by series connected resistors 81 and 82. The 4.49 volts reference voltage is available at the emitter electrode and is connected to pin 13 by line 83. Resistors 81 and 82 function as a voltage divider and a point common to both resistors provides a 4.42 reference voltage, whose use is described hereafter, on line 84.

A third section 86 of the quad operational amplifier includes input pins 5 and 6 and output pin 7. Pin 5 receives a 4.49 volts signal from line 83, line 51 is coupled to pin 6 by a capacitor 87 connected in series with a resistor 88, and pin 6 is coupled to pin 7 by a capacitor 89 connected in parallel with a resistor 90. This arrangement functions as a differentiator having an inverted output at pin 7 and a nominal output of 4.49 volts. A feature of the arrangement is that high frequency transients which might appear at the input are attenuated. Pin 7 is connected to line 53 and line 53 is coupled by a resistor 92 to pin 2 of a fourth section 93 of the quad operational amplifier. The Pin 3 of section 93 is connected to the 4.42 volts reference on line 84 and is coupled by resistor 94 to pin 1. Section 93 functions as a comparator wherein the binary level on pin 1 goes high when the voltage provided by pin 7 drops below 4.39 volts and remains high until the voltage at pin 7 exceeds 4.46 volts. Under the circumstances, the output on line 61 drops to a low binary level when the AGC voltage on line 42 is changing at a low rate.

The voltages referred to in describing the circuit shown in FIG. 3 and circuit functions may be obtained by using the following tabulation of values for the referenced elements.

| Resistor | Value |
|---|---|
| 71 | 3.3 K ohms |
| 72 | 33 K ohms |
| 74 | 6.8 K ohms |
| 76 | 240 K ohms |
| 78 | 43 K ohms |
| 80 | 33 K ohms |
| 81 | 680 ohms |
| 82 | 30 K ohms |
| 88 | 2.2 K ohms |
| 90 | 100 K ohms |
| 92 | 2.7 K ohms |
| 94 | 240 K ohms |

| Capacitor | Value | Semiconductor | Commercial No. |
|---|---|---|---|
| 87 | 0.68 μf | 70 | 2N3904 |
| 89 | 0.01 μf | 77 | 2N3904 |
|  |  | 79 | 1N914 |

Figure 4:
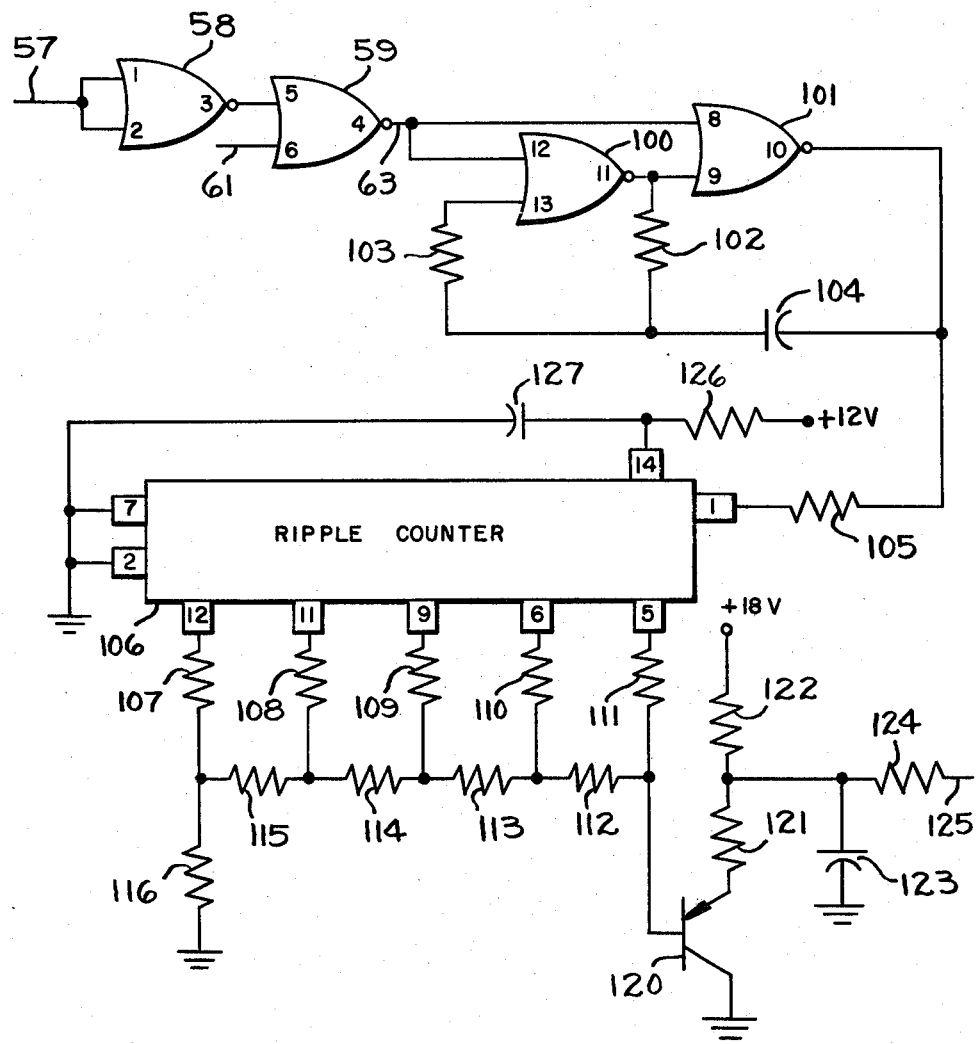
FIG. 4 is substantially a block diagram of a signal generator and a gate arrangement which controls the generator.

Referring to FIG. 4, which shows in more detail what is represented by boxes 54 and 55, line 57 is connected to a NOR gate 58 which is provided by pins 1, 2 and 3 of a quad 2-input NOR gate, manufactured by RCA under part no. CD 4001AE. Another NOR gate 59 is provided by pins 4, 5 and 6 of the 4001 unit and output pin 3 is connected to input pin 5. Line 61 is connected to pin 6 and pin 4 is connected to line 63 and provides thereon, in response to signals on lines 57 and 61, a binary signal for controlling a clock, indicated by reference 54 in FIG. 1. Referring again to FIG. 4, the clock includes a NOR gate 100 provided by pins 11, 12, and 13 of the 4001 unit and a NOR gate 101 provided by pins 8, 9 and 10. In the clock line 63 is connected to pins 8 and 12 and output pin 11 is connected to pin 9 and an end of resistor 102. The other end of resistor 102 is coupled by a feedback resistor 103 to pin 13 and by a capacitor 104 to output pin 10. Output pin 10 and capacitor 104 are coupled by a resistor 105 to the input pin of a ripple counter 106 which may be purchased under part no. CD4024AE from RCA. In the arrangement described, the clock is started when pin 4 of gate 59 goes low and is stopped when the pin goes high. The component values of the resistor 102 and capacitor 104 cause the clock to run at a 10 Hz rate. Counter 108 is biased at pin 14 by a resistor 126 which is connected to a 12 volts power supply and pin 14 is coupled to ground by a by-pass capacitor 127. Counter 106 is also connected to a ladder network. Specifically, pins 12, 11, 9, 6, 5 of counter 106 are connected, respectively, to one end of resistors 107, 108, 109, 110, 111. Resistor 112 couples resistors 110 and 111, resistor 113 couples resistor 110 and 109, resistor 114 couples resistors 108 and 109, resistor 115 couples resistors 107 and 108, and resistor 116 couples resistors 107 and 115 to ground. A 0 to 11 volts output signal is taken from the ladder network at a point between resistors 111 and 112 and is connected to the base electrode of a transistor 120. The output signal is generated from counter outputs which are added in the network to produce a step-like signal. When the maximum voltage level is reached, the next change lowers the voltage and another step sequence begins. Transistor 120, which may be ordered using the number 2N3906, has its collector electrode grounded and its emitter electrode coupled by series resistors 121 and 122 to a +18 volts power supply. The 0 to 11 volts input provides a 5 to 13 volts signal between resistors 122 and 121, the signal increasing in 0.25 volts increments when pulses are received from the clock. The signal is coupled by a by-pass capacitor 123, a coupling resistor 124, and line 125 to varactor 34 to sweep the band-pass at a filter rate of 10 Hz. It should be noted that during the sweeping operation digital signals are generated by the clock and counter. However, when the sweeping stops because the filter has been tuned to a received AM carrier, the clock stops and a constant output is provided by the counter, thereby avoiding the generation of RF signals which otherwise might interfere with the operation of the receiver.

The circuit shown in FIG. 4 may be manufactured to operate as described using the following values for the referenced components.

| Resistors | Values |
|---|---|
| 102 | 470 K ohms |
| 103 | 1 M ohms |
| 105 | 1 M ohms |
| 107 | 100 K ohms |
| 108 | 100 K ohms |
| 109 | 100 K ohms |
| 110 | 100 K ohms |
| 111 | 100 K ohms |
| 112 | 50 K ohms |
| 113 | 50 K ohms |
| 114 | 50 K ohms |
| 115 | 50 K ohms |
| 116 | 100 K ohms |
| 121 | 20 K ohms |
| 122 | 56 K ohms |
| 124 | 1 M ohms |
| 126 | 1 K ohms |

| Capacitors | Values |
|---|---|
| 104 | 0.1 μf |
| 123 | 0.001 μf |
| 127 | 0.01 μf |

The receiver described may be modified by persons skilled in the art in ways which are consistent with the spirit of the invention. Therefore, it should be understood that the description herein of a preferred embodiment, according to the invention has been set forth as an example thereof and should not be construed or interpreted to limit the scope of the claims which follow and define the invention.

What is claimed is:

1. A circuit for automatically fine tuning a bandpass filter in a receiver which is tunable to an amplitude modulated carrier signal at a frequency within a given relatively wide frequency band and which provides an output signal related to the amplitude modulation superimposed thereon, comprising:

(a) a band-pass filter coarsely tunable within said relatively wide band of frequencies for providing a filtered signal proportionally related to said received amplitude modulated carrier signal said band-pass filter including fine tuning means responsive to an automatic fine tuning signal for approximately centering the pass band of said filter about a selected frequency by adjusting said passband over a relatively narrow band of frequencies within said relatively wide band;

(b) means responsive to the presence of said filtered signal for generating a signal related to said modulation superimposed on said received carrier signal and for generating a first control signal which is related to the magnitude of said filtered signal;

(c) means for deriving a second control signal, the second control signal being related to the derivative with respect to time of the first control signal; and (d) digital circuit means responsive to the first and second control signals for supplying said band-pass filter fine tuning means with an automatic fine tuning signal.

2. A circuit as defined in claim 1 wherein the band-pass filter fine tuning means includes a voltage sensitive capacitor and wherein the digital circuit means for supplying an automatic fine tuning signal includes a signal generator and a logic circuit for controlling the generator to provide a bias voltage to the voltage sensitive capacitor.

3. A circuit as defined in claim 2 wherein the signal generator is a periodic staircase generator including a counter, a ladder network coupled to the counter, and a clock for driving the counter.

4. A circuit as defined in claim 3 wherein said logic circuit for controlling the generator includes: means responsive to the first control signal for providing a first binary signal; means responsive to the second control signal for providing a second binary signal; and gate means responsive to the first and second binary signals to the first and second binary signals for activating or inactivating the clock.

5. A circuit as defined in claim 1 wherein the band-pass filter fine tuning means includes a voltage sensitive capacitor and said digital circuit means includes means for supplying a bias voltage to the capacitor to fine tune the filter.

6. A circuit as defined in claim 5 wherein the voltage sensitive capacitor is a varactor diode.

7. A circuit as defined in claim 1 wherein said band-pass filter includes a first variable capacitor; wherein said means for generating a signal related to modulation superimposed on a carrier signal and for generating a first control signal includes a mixer, a local oscillator for driving the mixer, and an IF amplifier coupled to the mixer, the local oscillator including a variable tuning circuit useful for setting its frequency of oscillation to generate a modulated IF signal which is in the passband of the IF amplifier; and wherein the variable tuning circuit of the oscillator includes a second variable capacitor, the first and second capacitors being coupled for synchronous tuning of the band-pass filter and oscillator.

8. A circuit as defined in claim 7 wherein said means for generating said signal related to modulation on a carrier signal and for generating a first control signal includes an audio frequency detector coupled to the IF amplifier and an automatic gain control circuit associated with the detector.

9. A circuit as defined in claim 8 wherein the band-pass filter fine tuning means includes a voltage sensitive capacitor and said digital circuit means includes means for supplying a bias voltage to the voltage sensitive capacitor to fine tune the filter.

10. A circuit as defined in claim 9 wherein the voltage sensitive capacitor is a varactor diode.

11. The circuit of claim 1 wherein said digital circuit means includes a comparator means for comparing a control signal with a reference signal to avoid chattering in fine tuning said band-pass filter, said comparator having an upper trigger level A for providing a first response signal when the level of said control signal is greater than level A, said comparator having a lower trigger level B for providing a second response signal when the level of said control signal is less than level B, and wherein level A is not equal to level B.

12. The circuit of claim 11 wherein the trigger levels of said comparator are established by applying a reference voltage $V_R$ thereto wherein $V_R$ is approximately equal to $(A+B)/2$.

13. The circuit of claim 12 wherein said comparator is an operational amplifier having a reference input coupled through a first resistance $R_1$ to a predetermined potential and to its output through a second resistor wherein the ratio of $R_1$ to $R_2$ determines the range $(A-B)$.

* * * * *